(12) United States Patent
Meyer et al.

(10) Patent No.: US 9,024,520 B2
(45) Date of Patent: *May 5, 2015

(54) WHITE EMITTING LIGHT SOURCE AND LUMINESCENT MATERIAL

(71) Applicant: Koninklijke Philips N.V., Eindhoven (NL)

(72) Inventors: Joerg Meyer, Aachen (DE); Hans-Helmut Bechtel, Roetgen (DE); Walter Mayr, Alsdorf (DE); Peter Schmidt, Aachen (DE); Baby-Seriyati Schreinemacher, Eynatten (BE); Detlef Uwe Wiechert, Aldsdorf (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,988

(22) Filed: Jul. 1, 2014

(65) Prior Publication Data

US 2014/0319537 A1 Oct. 30, 2014

Related U.S. Application Data

(63) Continuation of application No. 13/917,673, filed on Jun. 14, 2013, now Pat. No. 8,796,916, which is a continuation of application No. 12/595,660, filed as application No. PCT/IB2008/051427 on Apr. 15, 2008, now Pat. No. 8,465,166.

(30) Foreign Application Priority Data

Apr. 20, 2007 (EP) .................................... 07106630

(51) Int. Cl.
*H01L 33/50* (2010.01)
*F21V 9/16* (2006.01)
(Continued)

(52) U.S. Cl.
CPC .......... *H01L 33/502* (2013.01); *C01B 21/0602* (2013.01); *C01P 2002/84* (2013.01); *C01P 2004/61* (2013.01); *C04B 35/581* (2013.01); *C04B 35/583* (2013.01); *C04B 35/584* (2013.01); *C04B 35/6455* (2013.01); *C04B 2235/3217* (2013.01); *C04B 2235/3224* (2013.01); *C04B 2235/3229* (2013.01); *C04B 2235/3418* (2013.01); *C04B 2235/3852* (2013.01); *C04B 2235/386* (2013.01);
(Continued)

(58) Field of Classification Search
None
See application file for complete search history.

(56) References Cited

U.S. PATENT DOCUMENTS 6,680,569 B2   1/2004   Mueller-Mach et al.
6,717,353 B1   4/2004   Mueller et al.
(Continued)

FOREIGN PATENT DOCUMENTS

EP   1296376 A2   3/2003
EP   1696016 A1   8/2006
(Continued)

*Primary Examiner* — Ashok Patel

(57) ABSTRACT

The invention relates to a white emitting light source with an improved luminescent material of the formula $(AEN_{2/3})*b (MN)*c (SiN_{4/3})*d1 CeO_{3/2}*d2 EuO*x SiO_2*y AlO_{3/2}$ wherein AE is an alkaline earth metal chosen of the group of Ca, Mg, Sr and Ba or mixtures thereof and M is a trivalent element chosen of the group of Al, B, Ga, Sc with $d1>10*d2$. In combination with a UV to blue light generating device this material leads to an improved light quality and stability, especially an improved temperature stability for a wide range of applications.

20 Claims, 4 Drawing Sheets

(51) Int. Cl.
*C01B 21/06* (2006.01)
*C04B 35/581* (2006.01)
*C04B 35/583* (2006.01)
*C04B 35/584* (2006.01)
*C04B 35/645* (2006.01)
*C09K 11/08* (2006.01)
*C09K 11/77* (2006.01)

(52) U.S. Cl.
CPC . *C04B2235/3865* (2013.01); *C04B 2235/3873* (2013.01); *C04B 2235/604* (2013.01); *C04B 2235/608* (2013.01); *C04B 2235/6582* (2013.01); *C04B 2235/9646* (2013.01); *C09K 11/0883* (2013.01); *C09K 11/7792* (2013.01); *C09K 11/7734* (2013.01); *H01L 2924/0002* (2013.01)

(56) References Cited

U.S. PATENT DOCUMENTS

| | | | |
|---|---|---|---|
| 7,378,792 B2 | 5/2008 | Huang et al. | |
| 8,465,166 B2 | 6/2013 | Meyer et al. | |
| 2004/0052080 A1 | 3/2004 | Hieda et al. | |
| 2006/0197439 A1 | 9/2006 | Sakane et al. | |
| 2008/0089089 A1 | 4/2008 | Hama et al. | |
| 2012/0326593 A1 | 12/2012 | Juang et al. | |
| 2013/0241395 A1* | 9/2013 | Matsuda et al. | 313/503 |
| 2014/0028180 A1* | 1/2014 | Hirosaki et al. | 313/503 |

FOREIGN PATENT DOCUMENTS

| | | |
|---|---|---|
| JP | 2005336450 A | 12/2005 |
| WO | 2005083037 A1 | 9/2005 |
| WO | 2005103199 A1 | 11/2005 |
| WO | 2006073141 A1 | 7/2006 |
| WO | 2006111907 A2 | 10/2006 |

* cited by examiner

WHITE EMITTING LIGHT SOURCE AND LUMINESCENT MATERIAL

CROSS-REFERENCE TO RELATED APPLICATIONS

This is a continuation of U.S. application Ser. No. 13/917,673, filed Jun. 14, 2013, by Joerg Meyer et al., titled "White Emitting Light Source and Luminescent Material, which is a continuation of U.S. application Ser. No. 12/595,660, filed Oct. 13, 2009, now U.S. Pat. No. 8,465,166, which is a National Stage Entry of PCT Application No. PCT/IB2008/051427, which is the International Application claiming priority to EPO Application Serial No. 07106630.2. Each of U.S. application Ser. No. 13/917,673, U.S. Pat. No. 8,465,166, PCT Application No. PCT/IB2008/051427, and EPO Application Serial No. 07106630.2 is incorporated herein by reference.

FIELD OF THE INVENTION

The present invention is directed to novel luminescent materials for light emitting devices, especially to the field of novel luminescent materials for LEDs.

BACKGROUND OF THE INVENTION

For illumination purposes high CRI light sources are generally preferred. White LEDs based on a single YAG:Ce luminescent colour converter usually reach $R_a$ values in the 70s with very bad colour rendering in the red spectral region. Therefore strong pressures exist for the development of efficient illumination grade white LEDs with excellent colour rendering over the entire visible spectral region. The obvious measure to improve colour rendering is the addition of a red emitting luminescent material (i.e. disclosed in the U.S. Pat. No. 6,717,353). However fabrication of white LEDs becomes more cumbersome due to the added degrees of freedom. Thus single phosphor options are deemed to be favourable if not superior.

However, there is still the continuing need for novel emitting luminescent materials which are usable within a wide range of applications and especially allow the fabrication of white phosphor converted LEDs (pcLEDs) with correlated colour temperature below 6000 K, optimized luminous efficiency and color rendering.

SUMMARY OF THE INVENTION

It is an object of the present invention to provide an illumination system which is usable within a wide range of applications and especially allows the fabrication of warm white pcLEDs with optimized luminous efficiency and color rendering.

This object is solved by an illumination system according to claim 1 of the present invention. Accordingly, an illumination system is proposed comprising at least one luminescent material essentially of the composition $a(AEN_{2/3})*b\,(MN)*c\,(SiN_{4/3})*d_1\,CeO_{3/2}*d_2\,EuO*x\,SiO_2*y\,AlO_{3/2}$ wherein AE is an alkaline earth metal chosen of the group of Ca, Mg, Sr and Ba or mixtures thereof and M is a trivalent element chosen of the group of Al, B, Ga, Sc or mixtures thereof with $$0.95 \leq 2*(a+d1+d2)/(b+c+x+y) \leq 1.2$$

$$a+d_1+d_2 \geq c+x,$$

$$(b+y):(c+x) \geq 1,$$

$$(b+y) \leq 1+10*d_1,$$

$$b \geq 5*y,$$

$$c \geq 10*x,$$

$$0.0001 \leq d_1 \leq 0.2 \text{ and } d1 \geq 10*d2.$$

The term "essentially" means especially ≥95%, preferably ≥97% and most preferred ≥99% wt-%. However, in some applications, trace amounts of additives may also be present in the bulk compositions. These additives particularly include such species known to the art as fluxes. Suitable fluxes include alkaline earth—or alkaline—metal oxides, fluorides, SiONes, SiAlONes, $SiO_2$ and the like and mixtures thereof.

Such an illumination system has shown for a wide range of applications within the present invention to have at least one of the following advantages:

- The colour control of the illumination system can be greatly enhanced due to the fact that for a wide range of applications within the present invention changes in the blue wavelength of the excitation source are compensated by spectral shift in the conversion layer.
- Overall very similar color points on the black body line of the chromaticity diagram may be hit independent of the excitation wavelength used for a wide range of applications within the present invention.
- The invented luminescent material shows excellent thermal and photo-thermal stability of the luminescence efficiency, this in combination with the above leads to a highly temperature stable illumination system.
- In addition, the invented luminescent material strongly absorbs near UV to blue light over a wide spectral range, so it can be used with various light sources.
- A special property of the material is its capability to generate a narrow range of color temperatures with different blue emission wavelength, determined by the material composition.

According to a preferred embodiment of the present invention, $$0.97 \leq 2*(a+d1+d2)/(b+c+x+y) \leq 1.15, \text{ preferably, } 1 \leq 2*(a+d1+d2)/(b+c+x+y) \leq 1.10.$$

This has been shown to lead to a material with further improved lighting features for a wide range of application within the present invention.

According to a preferred embodiment of the present invention, $d1 \geq 10*d2$, preferably $d1 \geq 20*d2$, more preferred $d1 \geq 30*d2$ and most preferred $d1 \geq 40*d2$.

This has been shown to lead to a material with further improved lighting features for a wide range of application within the present invention.

According to a preferred embodiment of the present invention, the Cerium doping level d1 is ≥0.01% and ≤20% of a, i.e. the molar amount of the alkaline earth ion content (Ca, Mg, Sr and Ba).

According to a preferred embodiment of the present invention, the Europium doping level d2 is ≥0.0001% and ≤2% of a, i.e. the molar amount of the alkaline earth ion content (Ca, Mg, Sr and Ba).

According to a preferred embodiment of the present invention, the full width half maximum (FWHM) of the emission spectra of said at least one luminescent material is ≥120 nm.

This has been shown to lead to a material with further improved lighting features for a wide range of applications within the present invention.

Preferably, the half-width of the emission spectra of said at least one luminescent material is ≥130 nm, more preferred ≥140 nm.

According to a preferred embodiment of the present invention, the emission spectrum of said at least one luminescent material shows a composed emission band comprising at least one maximum in the wavelength range between ≥500 and ≤600 nm, preferably ≥530 and ≤570 and a full width half maximum (FWHM) of ≥80 nm, preferably ≥100 and most preferred ≥120 nm and a second emission maximum in the wavelength range between ≥600 and ≤650 nm, preferably ≥600 and ≤620 nm and a full width half maximum (FWHM) of ≥30 and ≤140 nm, preferably ≤120 and most preferred ≤100 nm.

This has been shown to lead to a material with further improved lighting features for a wide range of applications within the present invention.

It goes without saying that the emission spectrum may be a superposition of these two emissions (which will actually be the case for most applications within this embodiment of the present invention) and therefore only one emission maximum may be observed. The two emissions may then be calculated by deconvolution.

According to a preferred embodiment of the present invention, after excitation with light emitting in the 400-480 nm spectral range, the relative emitted energy of the luminescent material in the 500-700 nm wavelength interval is ≥50%, more preferred ≥75%.

According to a preferred embodiment of the present invention, the ratio [M]:[Si], i.e. (b+y):(c+x), in said at least one luminescent material is ≥1.01 and ≤1.20. By doing so it has been surprisingly found that the (photo-) thermal stability may for a wide range of applications within the present invention be increased even further.

Preferably the ratio [M]:[Si] in said at least one luminescent material is ≥1.02 and ≤1.18, more preferred the ratio [M]:[Si] in said at least one luminescent material is ≥1.03 and ≤1.15.

This has been shown to lead to a material with further improved lighting features for a wide range of application within the present invention.

According to a preferred embodiment of the present invention (b+y) is ≥2*$d_1$, more preferred (b+y) is 5*$d_1$. This has been shown to lead to a material with further improved lighting features for a wide range of application within the present invention.

According to a preferred embodiment of the present invention, in said at least one luminescent material b is ≥5*y, preferably b is ≥10*y, more preferred b is ≥20*y. This has been shown to lead to a material with further improved lighting features for a wide range of application within the present invention.

According to a preferred embodiment of the present invention, in said at least one luminescent material c is ≥10*x, more preferably c is ≥20*x, more preferred c is ≥50*y. This has been shown to lead to a material with further improved lighting features for a wide range of application within the present invention.

According to a preferred embodiment of the present invention, in said at least one luminescent material d1 is ≤0.1. Preferably d1 is ≤0.03, more preferred $d_1$ is ≤0.01.

According to a preferred embodiment of the present invention, in said at least one luminescent material [Ba]+[Sr]+[Mg] is 0.9*[Ca], preferably [Ba]+[Sr]+[Mg] is ≤0.7*[Ca] and more preferred [Ba]+[Sr]+[Mg] is ≤0.5*[Ca]. This has been shown to lead to a material with further improved lighting features for a wide range of application within the present invention.

Preferably the at least one material is provided as powder and/or as ceramic material.

If the at least one material is provided at least partially as a powder, it is especially preferred that the powder has a $d_{50}$ of ≥2 μm and ≤15 μm. This has been shown to be advantageous for a wide range of applications within the present invention.

According to a preferred embodiment of the present invention, the at least one material is at least partly provided as at least one ceramic material.

The term "ceramic material" in the sense of the present invention means and/or includes especially a crystalline or polycrystalline compact material or composite material with a controlled amount of pores or which is pore free.

The term "polycrystalline material" in the sense of the present invention means and/or includes especially a material with a volume density larger than 90 percent of the main constituent, consisting of more than 80 percent of single crystal domains, with each domain being larger than 0.5 μm in diameter and having different crystallographic orientations. The single crystal domains may be connected by amorphous or glassy material or by additional crystalline constituents.

According to a preferred embodiment of the present invention, a light emitting device especially a LED is provided comprising at least one ceramic material with an average diameter from ≥100 μm to ≤2000 μm, more preferred ≥200 μm to ≤1500 μm, yet more preferred ≥250 μm to ≤1000 μm and most preferred ≥300 μm to ≤750 μm.

According to a preferred embodiment, the at least one ceramic material has a volume of ≥0.005 $mm^3$ to ≤8 $mm^3$, more preferred ≥0.03 $mm^3$ to ≤1 $mm^3$ and most preferred ≥0.08 $mm^3$ to ≤0.18 $mm^3$.

According to a preferred embodiment, the at least one ceramic material has a density of ≥90% and ≤100% of the theoretical density. This has been shown to be advantageous for a wide range of applications within the present invention since then the luminescent properties of the at least one ceramic material may be increased.

More preferably the at least one ceramic material has a density of ≥97% and ≤100% of the theoretical density, yet more preferred ≥98% and ≤100%, even more preferred ≥98.5% and ≤100% and most preferred ≥99.0% and ≤100%.

According to a preferred embodiment of the present invention, the surface roughness RMS (disruption of the planarity of a surface; measured as the geometric mean of the difference between highest and deepest surface features) of the surface(s) of the at least one ceramic material is ≥0.001 μm and ≤1 μm.

According to an embodiment of the present invention, the surface roughness of the surface(s) of the at least one ceramic material is ≥0.005 μm and ≤0.8 nm, according to an embodiment of the present invention ≥0.01 μm and ≤0.5 μm, according to an embodiment of the present invention ≥0.02 μm and ≤0.2 μm and according to an embodiment of the present invention ≥0.03 μm and ≤0.15 μm.

According to a preferred embodiment of the present invention, the specific surface area of the at least one ceramic material is ≥$10^{-7}$ $m^2$/g and ≤0.1 $m^2$/g.

A material and/or a light emitting device according to the present invention may be of use in a broad variety of systems and/or applications, amongst them one or more of the following:

Office lighting systems
household application systems
shop lighting systems, home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

BRIEF DESCRIPTION OF THE DRAWINGS

Additional details, features, characteristics and advantages of the object of the invention are disclosed in the subclaims, the figures and the following description of the respective figures and examples, which—in an exemplary fashion—show several embodiments and examples of a luminescent material for use in an illumination system according to the invention as well as several embodiments and examples of an illumination system according to the invention.

DETAILED DESCRIPTION OF EMBODIMENTS

The invention will be further understood by the following Example I which—in a merely illustrative fashion—shows several materials of the present invention.

Example I

Example I refers to

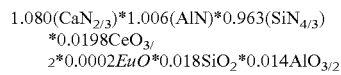

which was prepared in the following fashion:

All actions were carried out in dry inert gas atmosphere. 53.37 g $Ca_3N_2$ (2N), 41.02 g MN (3N), 0.78 g $Al_2O_3$, 45.30 g $Si_3N_4$, 1.09 g $SiO_2$, 3.41 g $CeO_2$ (4N) and 0.035 g $Eu_2O_3$ (4N) were intimately mixed by ball milling and the mixture was subsequently fired in forming gas atmosphere ($N_2$:$H_2$ 95:5 v/v) at 1500° C. maximum temperature. The obtained powder cake was again milled, granulated and pressed into pellets by uniaxial pressing and subsequent cold isostatic pressing until a green density of >50% was reached. The pellets were sintered at 1650° C. in forming gas atmosphere, optionally this is followed by a hot isostatic pressing step at 1 kbar $N_2$ to improve the density.

Figure 7:
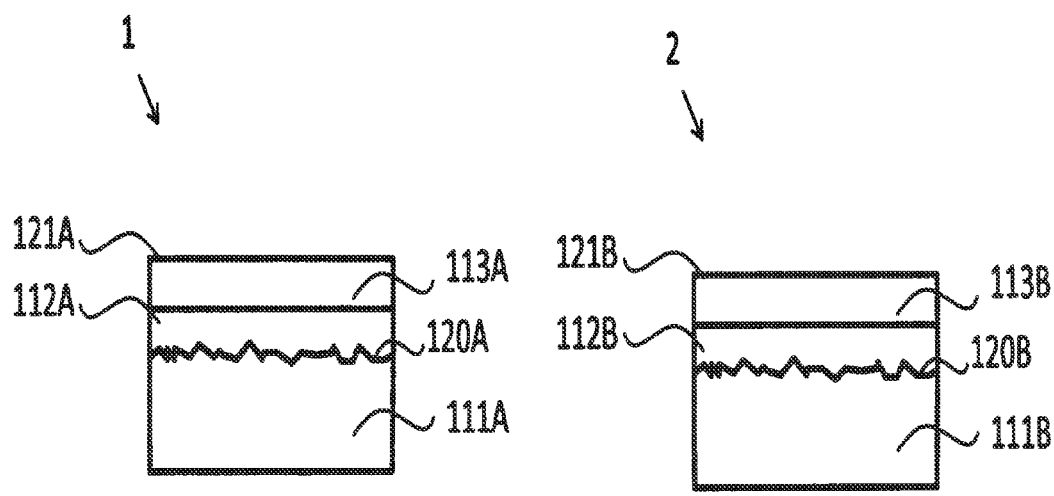
FIG. 7 shows a schematic diagram of illumination systems.

FIG. 7 shows a blue LED 1 and a blue LED 2 (=illuminations systems). Each of n-GaN layers 111A, 111B of LEDs 1, 2 are optically coupled by transparent glue 112A, 112B with a refractive index of 1.5 (silicone) to the luminescent ceramic plates 113A, 113B, which form the outer surfaces 121A, 121B of the illumination, systems 1, 2. Besides the optical functionality of the ceramic plates 113A, 113B they also form a rigid mechanical protection for the underlying roughened surfaces 120A, 120B of n-GaN layers 111A, 111B of the LEDs.

Figure 1:
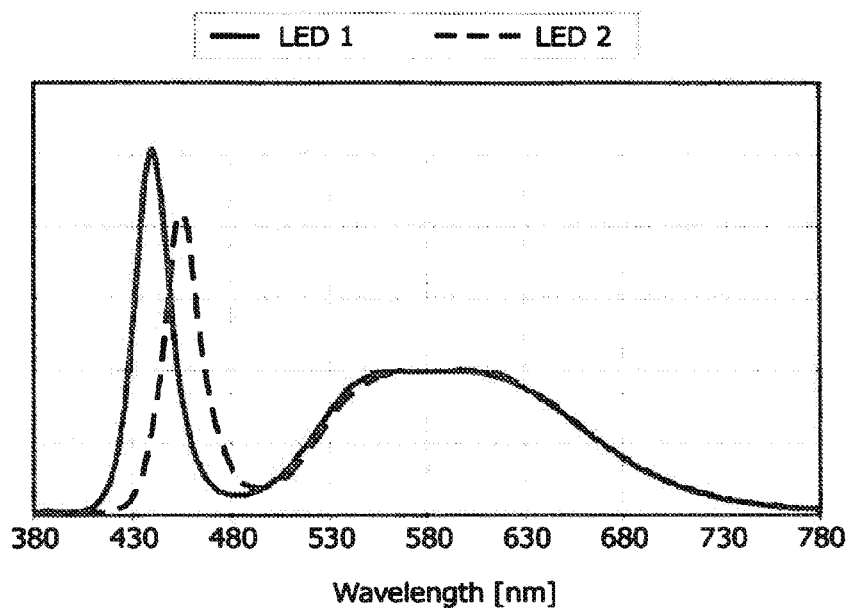
FIG. 1 shows two emission spectra of two illumination system according to the present invention with LEDs emitting at different blue wavelengths combined with the luminescent material according to Example I of the present invention.

FIG. 1 shows a white LED emission spectra with a luminescent ceramic plate made out of the material according to example I with 150 µm thickness on blue LED 1 with a dominant emission wavelength of 450 µm and blue LED 2 with a dominant emission wavelength of 464 µm. As described above the 1 mm² thin-film flip-chip InGaN—GaN LEDs 1, 2 are optically coupled by a transparent glue 112A, 112B with a refractive index of 1.5 (silicone) to the luminescent ceramic plates 113A, 113B, which forms the outer surfaces 121A, 121B of the illumination systems. Besides the optical functionality of the ceramic plates 113A, 113B they also form a rigid mechanical protection for the underlying roughened surfaces 120A, 120B of n-GaN layers 111A, 111B of the LEDs.

It can be seen that the material according to Example I has a broad band in the wavelength range of 500-700 µm leading to a warm-white emission spectrum of the illumination systems with a correlated color temperature (CCT) between 3000 and 4000 K.

Figure 2:
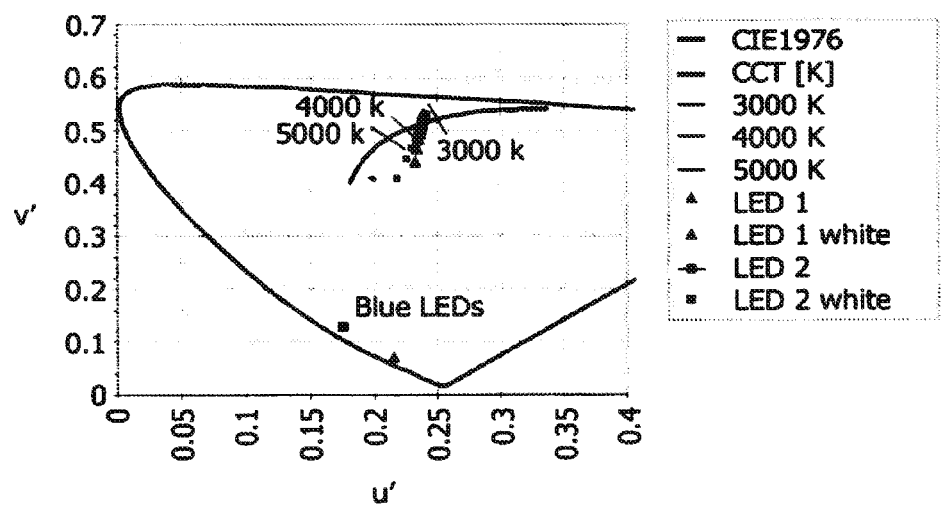
FIG. 2 shows CIE 1976 color coordinates of the two illumination systems of FIG. 1 with different thickness plates of the luminescent ceramics.

FIG. 2 shows the color points of the LEDs with luminescent ceramic plate (=illumination systems) of FIG. 1 together with the color points of the blue LEDs used in a CIE 1976 diagram.

Figure 3:
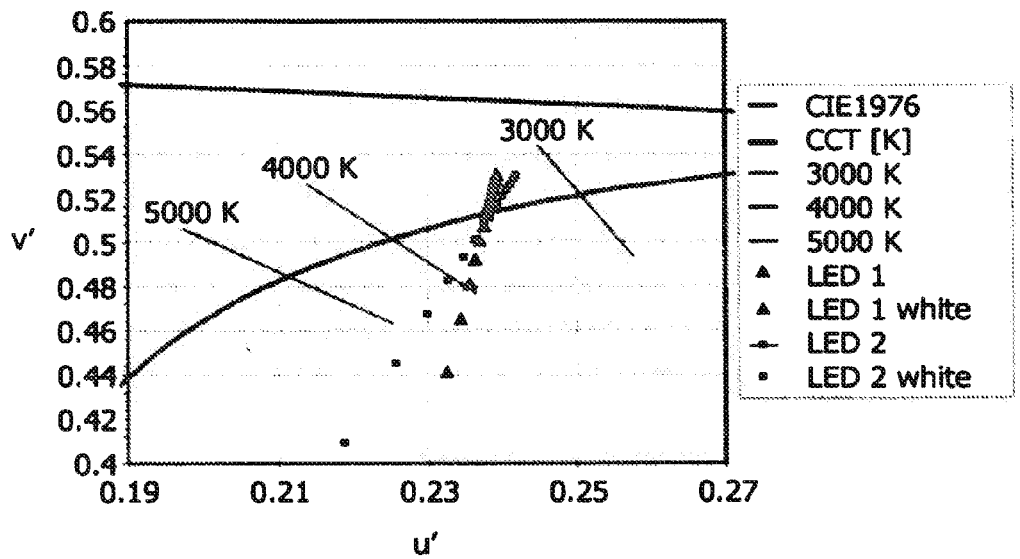
FIG. 3 shows a zoom of FIG. 2 in the white region

FIG. 3 shows a zoomed view on the white region of FIG. 2. In this view the specific property of the luminescent material is visible to counteract a variation of the blue LED emission. This property is very beneficial for white LEDs in general illumination applications to realize a stable white emission color (stable CCT), even if the LED emission spectrum undergoes changes due to variations in drive current and junction temperature.

Figure 4:
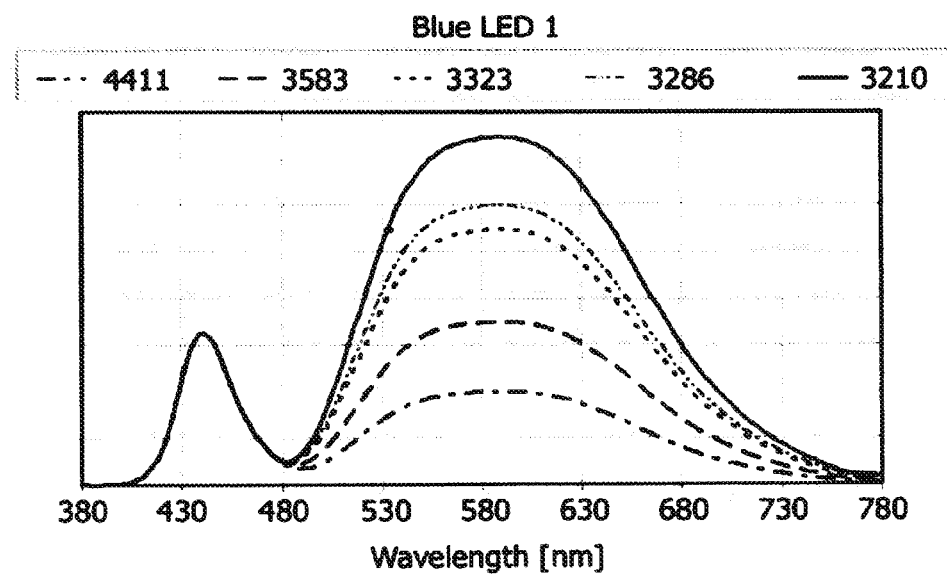
FIG. 4 shows several emission spectra of further illumination systems according to the present invention employing different thickness plates of the luminescent ceramics according to Example I of the present invention
Figure 5:
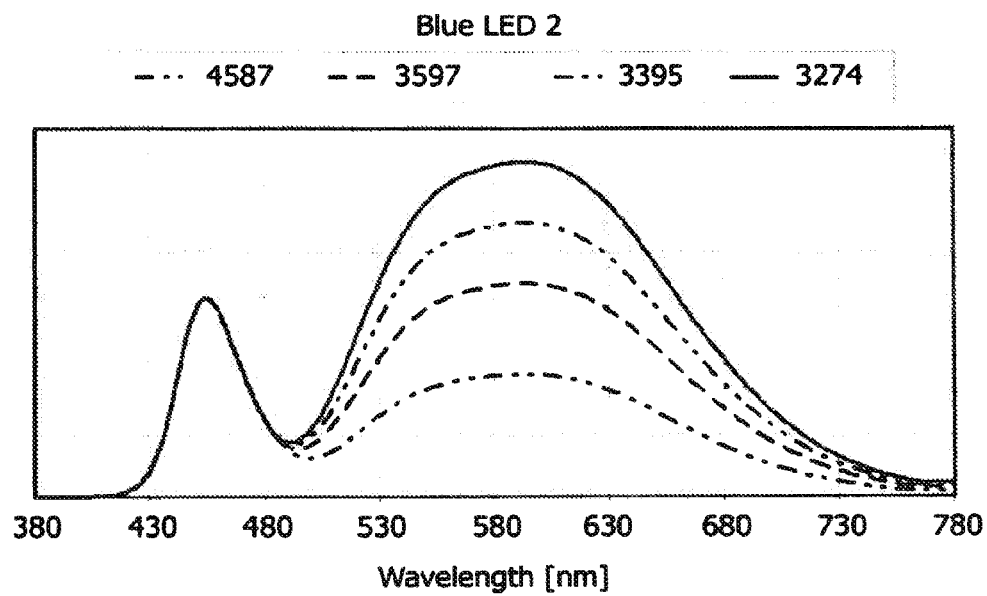
FIG. 5 shows further several emission spectra of further illuminations systems according to the present invention employing different thickness plates of the luminescent ceramics according to Example I of the present invention

FIGS. 4 and 5 show emission spectra of selected white emitting LEDs with the blue pumping LEDs, LED 1 for FIG. 4 and LED 2 for FIG. 5, respectively.

It can be shown that with the material according to Example I several LEDs with low CCT and excellent colour rendering indices $R_a$ and high colour rendering index $R_9$ could be fabricated. $R_9$ is a measured for the reproduction of saturated red colours. The data are shown in Table I and II, whereby Table I refers to the spectra of FIG. 4 and Table II refers to the spectra of FIG. 5.

TABLE I

| CCT [K] | 4411 | 3583 | 3323 | 3286 | 3256 | 3231 | 3210 |
|---|---|---|---|---|---|---|---|
| Ra | 82 | 76 | 73 | 73 | 73 | 73 | 72 |
| Δuv | 0.025 | 0.006 | 0.004 | 0.006 | 0.007 | 0.008 | 0.009 |
| x | 0.3535 | 0.3942 | 0.4207 | 0.4251 | 0.4289 | 0.4323 | 0.4352 |
| y | 0.3116 | 0.3701 | 0.4081 | 0.4144 | 0.4199 | 0.4247 | 0.429 |
| LE [lm/W] | 273 | 307 | 327 | 330 | 333 | 335 | 337 |
| R1 | 87.5 | 76.8 | 72.2 | 71.5 | 70.9 | 70.4 | 70 |
| R2 | 86.1 | 81.2 | 78.1 | 77.6 | 77.2 | 76.9 | 76.6 |
| R3 | 77.6 | 80.9 | 81.1 | 81.2 | 81.3 | 81.4 | 81.5 |
| R4 | 81.7 | 75.5 | 73.8 | 73.5 | 73.3 | 73.1 | 73 |
| R5 | 85.2 | 74.2 | 69.2 | 68.4 | 67.8 | 67.2 | 66.8 |
| R6 | 75.7 | 70.7 | 66.6 | 66.1 | 65.6 | 65.1 | 64.8 |
| R7 | 82.9 | 82.7 | 83.9 | 84.2 | 84.5 | 84.8 | 85.1 |
| R8 | 81.2 | 67.9 | 63 | 62.3 | 61.7 | 61.2 | 60.8 |
| R9 | 55.3 | 17.7 | 3.2 | 1 | −0.7 | −2.2 | −3.5 |
| R10 | 60.4 | 52 | 46.4 | 45.6 | 44.9 | 44.3 | 43.8 |
| R11 | 78.3 | 69.8 | 67.1 | 66.7 | 66.3 | 66 | 65.7 |
| R12 | 63.3 | 49.9 | 40.3 | 38.8 | 37.6 | 36.5 | 35.6 |
| R13 | 85.5 | 76.6 | 72 | 71.4 | 70.8 | 70.3 | 69.9 |
| R14 | 85.6 | 88.2 | 88.6 | 88.7 | 88.7 | 88.8 | 88.9 |

TABLE II

| CCT [K] | 4587 | 3597 | 3395 | 3274 | 3230 | 3194 | 3163 | 3138 |
|---|---|---|---|---|---|---|---|---|
| Ra | 89 | 81 | 79 | 77 | 76 | 76 | 75 | 75 |
| Δuv | 0.021 | 0.006 | 0 | 0.003 | 0.005 | 0.006 | 0.007 | 0.008 |
| x | 0.3505 | 0.3942 | 0.4109 | 0.4228 | 0.4275 | 0.4316 | 0.4353 | 0.4385 |
| y | 0.3167 | 0.3716 | 0.3927 | 0.4076 | 0.4135 | 0.4187 | 0.4233 | 0.4273 |
| LE [lm/W] | 275 | 306 | 317 | 324 | 327 | 330 | 332 | 334 |
| R1 | 92.1 | 80.9 | 77.1 | 74.6 | 73.7 | 72.9 | 72.2 | 71.6 |
| R2 | 94.8 | 89.4 | 85.9 | 83.6 | 82.7 | 81.9 | 81.3 | 80.7 |
| R3 | 93.2 | 91.1 | 89.6 | 88.5 | 88.1 | 87.7 | 87.4 | 87.1 |
| R4 | 83.1 | 75.7 | 73.9 | 72.8 | 72.3 | 72 | 71.6 | 71.4 |
| R5 | 88.7 | 78.2 | 74.1 | 71.3 | 70.3 | 69.4 | 68.6 | 67.9 |
| R6 | 85.9 | 80.6 | 76.5 | 73.5 | 72.4 | 71.4 | 70.6 | 69.8 |
| R7 | 87.8 | 86.5 | 87 | 87.4 | 87.6 | 87.7 | 87.9 | 88.1 |
| R8 | 84.7 | 69.5 | 65.8 | 63.5 | 62.6 | 61.8 | 61.2 | 60.7 |
| R9 | 69.4 | 26.7 | 15.7 | 8.6 | 5.9 | 3.7 | 1.7 | 0.1 |
| R10 | 87.9 | 69.6 | 62.6 | 57.9 | 56.2 | 54.7 | 53.4 | 52.3 |
| R11 | 75.9 | 67.7 | 65.6 | 64.2 | 63.7 | 63.2 | 62.8 | 62.5 |
| R12 | 65.6 | 55.8 | 48.4 | 42.9 | 40.7 | 38.8 | 37.2 | 35.6 |
| R13 | 94.1 | 82.9 | 78.7 | 76 | 74.9 | 74.1 | 73.3 | 72.6 |
| R14 | 95.9 | 94.3 | 93.3 | 92.7 | 92.5 | 92.3 | 92.1 | 92 |

Figure 6:
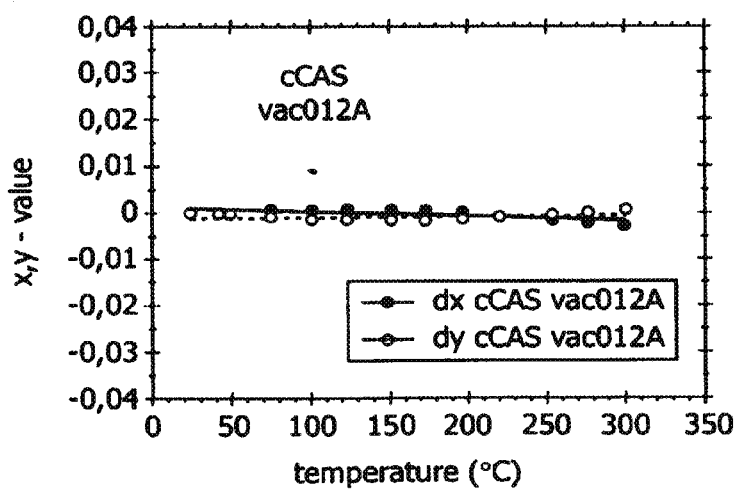
FIG. 6 shows a diagram of the x-y-color point coordinates against the temperature of a luminescent material according to Example I of the present invention.

FIG. 6 shows a diagram of the x-y-color coordinates (CIE 1931) against the temperature of a luminescent material according to Example I of the present invention. In this Figure it can be clearly seen that the x-y-color point stays nearly constant with temperature, which leads to an excellent color stability for a wide range of illumination systems according to the present invention.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A device comprising:
a luminescent material comprising:
$(AEN_{2/3})*b \ (MN)*c \ (SiN_{4/3})*d_1 CeO_{3/2}*d_2 EuO*xSiO_2*yAlO_{3/2}$ wherein AE is an alkaline earth metal chosen from a group consisting of Ca, Mg, Sr and Ba or mixtures thereof and M is a trivalent element chosen from a group consisting of Al, B, Ga, Sc or mixtures thereof, wherein $0.95 \leq 2*(a+d_1+d_2)/(b+c+x+y) \leq 1.2$ $a+d_1+d_2 \geq c+x,$ $(b+y):(c+x) \geq 1,$ $(b+y) \leq 1+10*d_1,$ $b \geq 5*y,$ $c \geq 10*x,$ $0.0001 \leq d_1 \leq 0.2$ and $d_1 \geq 10*d_2;$ and at least one flux.

2. The device of claim 1 wherein the luminescent material is ≥95% $(AEN_{2/3})*b$ $(MN)*c$ $(SiN_{4/3})*d_1 CeO_{3/2}*d_2EuO*xSiO_2*yAlO_{3/2}$.

3. The device of claim 1 wherein the at least one flux comprises an alkaline earth material.

4. The device of claim 1 wherein the at least one flux comprises an alkaline material.

5. The device of claim 1 wherein the at least one flux comprises one of a metal oxide and a fluoride.

6. The device of claim 1 wherein the at least one flux comprises one of SiON, SiAlON, and $SiO_2$.

7. The device of claim 1 wherein (b+y):(c+x) is ≥1.01 and ≤1.20.

8. The device of claim 1 wherein (b+y) is ≤$1+10*d_1$.

9. The device of claim 1 wherein b≥5*y and c≥10*x.

10. The device of claim 1 further comprising a light source configured to emit light having a wavelength between 400 nm and 480 nm, wherein the luminescent material is positioned to absorb light emitted by the light source.

11. A device comprising:
a blue LED comprising an n-GaN layer; and
a ceramic plate attached to the blue LED, the ceramic plate comprising a luminescent material, the luminescent material comprising $(AEN_{2/3})*b$ $(MN)*c$ $(SiN_{4/3})*d_1CeO_{3/2}*d_2EuO*xSiO_2*yAlO_{3/2}$ wherein AE is an alkaline earth metal chosen from a group consisting of Ca, Mg, Sr and Ba or mixtures thereof and M is a trivalent element chosen from a group consisting of Al, B, Ga, Sc or mixtures thereof, wherein $0.95 \leq 2*(a+d_1+d_2)/(b+c+x+y) \leq 1.2$ $a+d_1+d_2 \geq c+x$, $(b+y):(c+x) \geq 1$, $(b+y) \leq 1+10*d_1$, $b \geq 5*y$, $c \geq 10*x$, $0.0001 \leq d_1 \leq 0.2$ and $d_1 \geq 10*d_2$.

12. The device of claim 11 wherein the n-GaN layer is optically coupled to the ceramic plate by a transparent glue.

13. The device of claim 12 wherein the transparent glue is silicone.

14. The device of claim 11 wherein a surface of the n-GaN layer facing the ceramic plate is roughened.

15. The device of claim 14 wherein the ceramic plate forms a rigid mechanical protection for the roughened n-GaN surface.

16. The device of claim 11 wherein a full width half maximum of an emission spectrum of the luminescent material is ≥120 nm.

17. The device of claim 11 wherein the emission spectrum of the luminescent material comprises:
an emission maximum in a wavelength range between 500 and 600 nm having a full width half maximum of ≥80 nm; and
an emission maximum in a wavelength range between 600 and 650 nm having a full width half maximum of ≥30 and ≤140 nm.

18. The device of claim 11 wherein ceramic plate has a density ≥90% of a theoretical density.

19. The device of claim 11 wherein the ceramic plate comprises a main constituent and pores; the ceramic plate has a volume density larger than 90 percent of the main constituent; and the main constituent is more than 80 percent single crystal domains.

20. The device of claim 11 wherein combined light comprising light emitted by the blue LED and light emitted by the luminescent material has a correlated color temperature between 3000 and 4000 K.

* * * * *